United States Patent [19]

Beer

[11] Patent Number: 4,682,112

[45] Date of Patent: Jul. 21, 1987

[54] NMR ANTENNA AND METHOD FOR DESIGNING THE SAME

[75] Inventor: Steve Beer, Burlington, Mass.

[73] Assignee: Elscint Ltd., Haifa, Israel

[21] Appl. No.: 659,457

[22] Filed: Oct. 10, 1984

[51] Int. Cl.$^4$ .......................................... G01R 33/20
[52] U.S. Cl. .................................. 324/322; 324/312; 324/314
[58] Field of Search ............... 324/307, 309, 314, 318, 324/322, 320, 313

[56] References Cited

U.S. PATENT DOCUMENTS

| | | | |
|---|---|---|---|
| 3,873,909 | 3/1975 | Ernst | 324/312 |
| 4,291,272 | 9/1981 | Hofer et al. | 324/313 |
| 4,468,621 | 8/1984 | Hinshaw | 324/309 |
| 4,471,305 | 9/1984 | Crooks et al. | 324/314 |
| 4,475,084 | 10/1984 | Moore et al. | 324/309 |

OTHER PUBLICATIONS

Turner, How to Use Grid–Dip Oscillators, 2nd Edition, 1969, pp. 69–78.

*Primary Examiner*—Stewart J. Levy
*Assistant Examiner*—Kevin D. O'Shea
*Attorney, Agent, or Firm*—Sandler & Greenblum

[57] ABSTRACT

An antenna system for nuclear magnetic resonance (NMR) imaging or spectroscopy devices which produce a uniform magnetic field in an object under examination includes transmit and receive antenna arrays each comprising a group of loop antennas. A signal generating circuit produces a set of input antenna signals which are applied to the loop antennas of the transmit array which transmits RF signals of a frequency that perturbs the magnetic moment of nuclei in a volume of the object. The receiving antenna array is responsive to NMR signals produced by the relaxation of perturbed nuclei in said volume for producing a set of output antenna that are applied to a signal processing circuit. A control circuit selectively controls the relative phases and amplitudes of at least one set of antenna signals to control the size and location of the region of the volume in which excitation of nuclei occurs, or from which NMR signals are processed. The relative phases and amplitudes can be controlled in such a way that nuclei in only a preselected region of the volume are excited, and that NMR signals from nuclei in only a preselected region of the volume are processed.

34 Claims, 4 Drawing Figures

NMR ANTENNA AND METHOD FOR DESIGNING THE SAME

TECHNICAL FIELD

This invention relates to a nuclear magnetic resonance (NMR) antenna system and to a method for designing the same to improve its signal-to-noise ratio and efficiency.

BACKGROUND OF THE INVENTION

NMR imaging or spectroscopy involves the production of a relatively strong, steady, and spatially uniform magnetic field in an object to be examined, and perturbing radio-frequency (RF) signals. When the frequency of the RF signals is related to the strength of the magnetic field by the gyro-magnetic ratio of nuclei of interest in the object, said nuclei are excited, or perturbed, by the RF signals. Upon termination of the RF signals, the excited nuclei relax thereby emitting what are commonly referred to as NMR signals at the same frequency as the perturbing RF signals. The NMR signals are received by a similar, or the same, antenna coil.

Each circuit path in a living object, by reason of its temperature and resistivity, constituted a small noise source which is coupled to the receiving antenna coil. Consequently, the received signal includes a component from these noise sources which reduces the signal-to-noise ratio of the system.

While it is possible to measure the NMR signal for a local sub-volume of an object (e.g., the spine of a living patient), the contribution of noise from all of the object volume severely compromises the signal-to-noise ratio and reduces image quality. An additional problem in localized imaging is the non-discriminate delivery of RF power into the entire volume of the patient during excitation. This is costly to generate, and results in unnecessary heat dose to non-imaged regions of the patient.

A conventional way to improve the signal-to-noise ratio in both NMR spectroscopy and imaging is to localize the transmitted and received fields using a surface coil antenna that basically is a planar loop of wire positioned adjacent the region of the patient to be imaged. Such loop will discriminately excite and receive signals from only a limited sub-region of a patient. This approach has many shortcomings: multiple side lobes, highlighted near-skin signals with reduced signals from the actual region of interest when such region is interior to the patient, capacitive effects with the patient, and sensitivity of the results to patient movement. In addition, a surface coil, by its nature, is capable of receiving radiation from only a limited solid angle with the result that much of the radiated signal emitted by an excited nucleus is lost thus limiting the actual signal-to-noise ratio.

It is therefore an object of the present invention to provide a new and improved NMR antenna system which does not suffer from the deficiencies of the prior art, and which has an improved signal-to-noise ratio as compared to the prior art, and to a method for designing such improved NMR antenna system.

BRIEF DESCRIPTION OF THE INVENTION

An antenna system according to the present invention for an NMR imaging or spectroscopy device which produces a substantially uniform magnetic field in an object under examination includes transmit and receive antenna arrays, each comprising a group of loop antennas. Signal generating means produces a set of antenna signals which are applied to the loop antennas of the transmit array which transmit RF signals at a frequency functionally related to the magnetic field strength for perturbing the magnetic moment of nuclei in a volume of the object. The receive antenna array is responsive to NMR signals produced by the relaxation of perturbed nuclei in said volume for producing a set of output antenna signals that are applied to and processed by signal processing means. Finally control means selectively controls the relative phases and amplitudes of at least one of said sets of antenna signals for controlling the size and location of the region in the volume in which excitation occurs, or from which NMR signals are processed by the signal generating means.

In one aspect of the invention, the control means is associated with the signal generating means and is constructed and arranged to control the relative phases and amplitudes of the set of input antenna signals produced by the signal generating means for localizing excitation of nuclei in a preselected region of said volume. Stated otherwise, the control means in such case is effective to enhance RF signals present in the selected region while substantially reducing RF signals present elsewhere in the volume of the object. Localized enhancement of the RF signals in the object is achieved by controlling the relative phases and amplitudes of the signals transmitted from the loop antennas so as to achieve constructive reinforcement of signals in the selected region and destructive interference of signals outside the selected region. Thus, the efficiency of power transfer is maximized from the transmitter to the selected region; and heat dose to the object by reason of the RF signals is minimized.

In another aspect of the invention, the control means is associated with the signal processing means and is constructed and arranged to control the relative phases and amplitudes of the set of output antenna signals produced by the receiving antenna array for limiting processing of NMR signals produced by the relaxation of perturbed nuclei to those NMR signals from a preselected region of said volume. NMR signals emitted by excited nuclei throughout the volume, including sources within and without the selected region, are received simultaneously by the antenna loops, but at different phases and amplitudes. The processing of this set of driving signals takes into account the spatial positions of the loops producing the driving signals by controlling the relative phases and amplitudes of the processed signals such that the contribution to the processed signals from NMR signals emanating from the selected region is significantly greater than the contribution from NMR signals emanating elsewhere in the volume.

The above described arrangement is adequate for NMR spectroscopy applications where only the average signal from a selected volume is of interest. However, in the case of NMR imaging, a selected volume is resolved into finer volume elements (voxels) using spatial encoding achieved by the introducion of dynamic gradient magnetic fields. Thus, the above described arrangement can be used in conjunction with performing conventional spatial encoding for higher resolution reconstructions of cross-sections of the selected volume.

BRIEF DESCRIPTION OF DRAWINGS

An embodiment of the present invention is disclosed in the accompanying drawings wherein.

DETAILED DESCRIPTION

Figure 1:
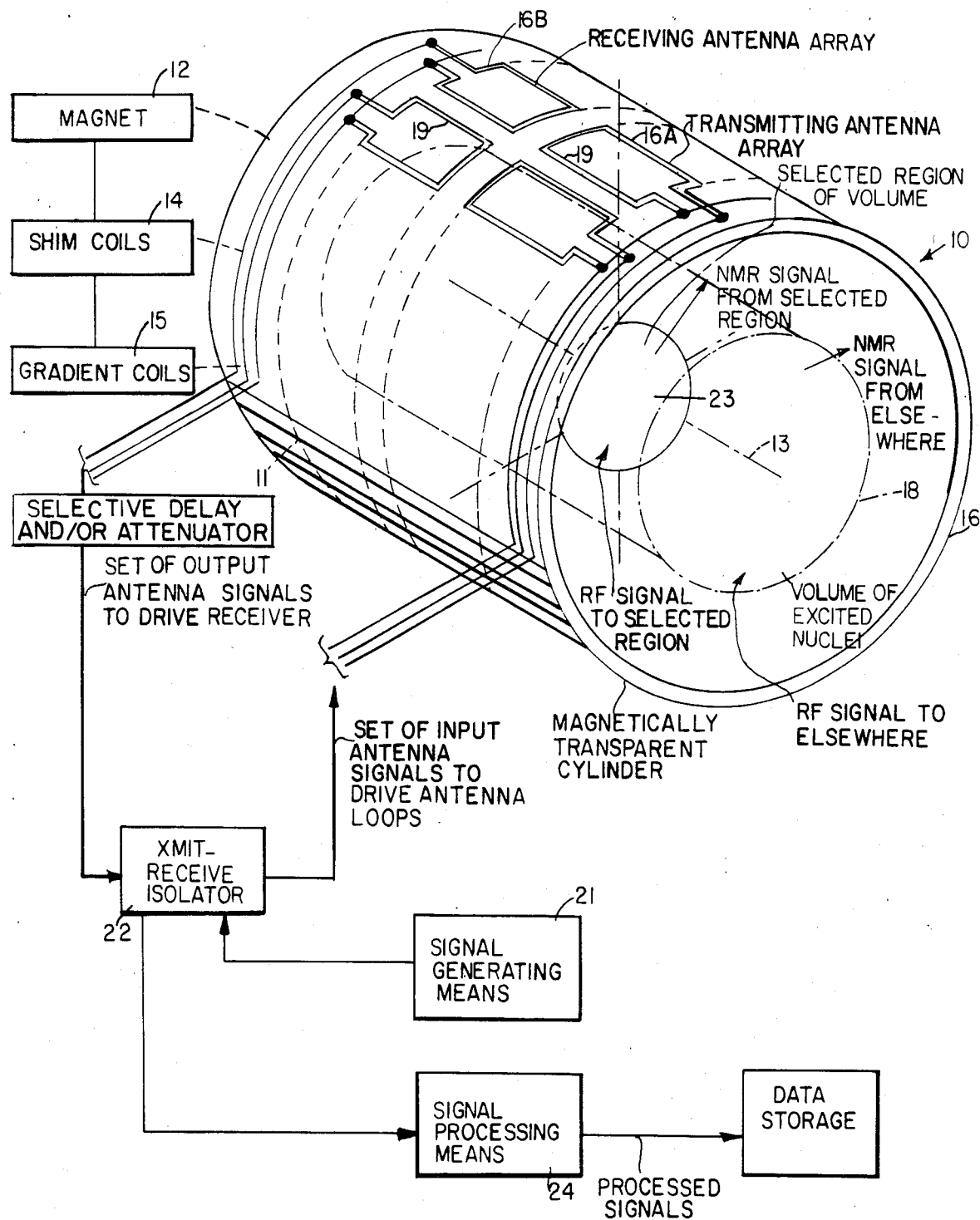
FIG. 1 is a perspective schematic drawing of an NMR imaging device showing an antenna according to the present invention.

Referring now to the drawing, reference numeral 10 designates an NMR imaging device into which antenna 11 according to the present invention is incorporated. Device 10, which is shown schematically in FIG. 1, includes magnet 12 producing a spatially uniform, steady magnetic field which may be directed along axis 13 of the device. Conventional shim coils 14, in association with magnet 12, provide for shimming the magnetic field to ensure its uniformity. Gradient coils 15 associated with device 10 are conventional in nature and are operative to produce a gradient in the magnetic field for the purpose of space encoding a localized region to enable three-dimensional reconstruction in the imaging mode. If only spectroscopy is to be performed, gradient coils need not be utilized.

Antennaa 11, according to the present invention, is mounted on electro-magnetically transparent cylinder 16 such as a Plexiglass cylinder, which is coaxial with axis 13. The size of cylinder 16 is such as to permit entrance or egress of object 18, such as a patient in the case of NMR imaging. While cylinder 16 is shown as being a right circular cylinder, the cross-sectional shape of the cylinder is not significant except that the cylinder should encompass the volume of the object under investigation. In this way, almost all of the omnidirectional NMR signals produced by excited nuclei are intercepted by the antenna array that is mounted on the cylinder.

Mounted on cylinder 16 is an array of loop antennas which may be arranged in two groups 16A and 16B. The drawing shows the groups in a side-by-side, axially displaced arrangement for more clearly illustrating the present invention; but the groups could overlie. Group 16A may be associated with transmission of an RF signal of the appropriate frequency to excite the desired nuclei in object 18 inside the cylinder; and group 16B may be associated with receiving NMR signals produced by the relaxation of excited nuclei within the object. As indicated above, groups 16A and 16B are show as two separate groups; but the groups could be combined into a single array that serves a transmit or receive function at different times.

In the preferred embodiment of the antenna, individual elements 19 of each group are located on the cylinder and are uniformly distributed azimuthally, or angularly, around the cylinder. Furthermore, loops 19 of the groups are uniformly distributed on the cylinder in its axial direction as shown in FIG. 1. Group 16A (transmit) is driven by a set of input antenna signals applied to respective loops in the group by signal generating means 21 through isolator 22. The wiring between the loops of group 16A and signal generating means 21 is such as to permit the loops to be individually addressed in order to control the relative phases and amplitudes of the RF signals radiated from the loops. Alternatively, the individual loops may be serially driven by an input antenna signal applied to the loops which are interconnected by delay lines as described below.

The input antenna signals produced by the signal generating means and applied to the individual loops of this group are selected (in the manner described below) to result in localized excitation of nuclei in preselected region 23 of object 18. This is achieved because the relative phases and amplitudes of the RF signals transmitted by the set of antenna loops of group 16A are controlled to result in constructive reinforcement of the RF signals in region 23, while destructive interference occurs elsewhere in the volume. In a particularly simple arrangement, the set of driving signals produced by signal generating means 21 is such that the phase of the driving signal applied to a given loop in group 16A is functionally related to the azimuthal angle of the loop.

In order to establish the necessary phase relationship between the individual loops of group 16A, signal generating means 21 may individually address the loops of the group with a set of input antenna signals which have the required relative phases and amplitudes. Alternatively, loops of this group may be serially connected through delay lines; and in such case, the signal generating means would produce a signal, which when applied to the antenna, is equivalent to the set of input antenna signals described above. Components other than delay lines can be used to establish the desired phase relationship. For example, circuitry utilizing both active as well as passive components may be used to control the phase relationship between the set of input antenna signals applied to the loops of group 16A. Instead of achieving the required phase shifts by the introduction of delay lines beween the various loops of group 16A, delay lines can be interposed between the signal generating means and the individually addressed loops. In the latter case, the driving signals would have the same phase. Thus, the term "controlling the relative phases of the antenna signals", in the context of the transmit mode of operation, means that the phase of the transmitted RF signals is controlled by applying to the loops of group 16A signals that differ in phase because of a phase shifting arrangement interposed between the signal generating means and the loops, or by phase shifting the driving signals themselves. It may be necessary under some circumstances to vary the amplitude of the signals from loop to loop as a function of azimuth or axial extent, and in this case attenuators could be utilized between successive loops. Alternatively, active as well as passive amplitude modifying devices can be use.

The presence of RF signals of the appropriate frequency in region 23, and indeed elsewhere in volume 18, in the presence of the steady magnetic field along axis 13 excite nuclei of interest causing a tilt in their magnet moments out of alignment with the external magnetic field produced by magnet 12. When the RF excitation signals are removed, the excited nuclei "relax" (i.e., return into alignment) emitting what are termed NMR signals of the same frequency as the RF excitation frequency. These NMR signals are received by the receiving antenna array consisting of the loops of group 16B. Such loops are responsive to NMR signals for producing a set of output antenna signals that are applied, through isolator 22, to signal processing means 24. The latter controls the relative phase and amplitude of each antenna signal during its processing in accordance with the spatial location of the particular loop in group 16B that produced the antenna signal. Specifically, the signal processing means is constructed and arranged (in the manner described below) to control the size and location of the region (e.g. region 23) in the object from which NMR signals are processed by the signal processing means.

During the receive mode, NMR signals emitted from local region of interest 23 are received by the array of loops of group 16B, processed in the signal processing means, and passed on to data storage means 25. NMR signals from locations outside the region of interest are discriminated against by the analog or digital processing techniques described below.

In the manner described above, the loop elements of the cylindrical phased-array antenna localize within the object both the transmitted and received radiation. A method by which the required phase relationships are obtained for an optimal localization scheme is described below making reference to a 2-D case. As is shown below, the actual situation with a 3-D object surrounded by a 2-D array in 3-D space is merely an extension of the simple 2-D case.

Figure 2:
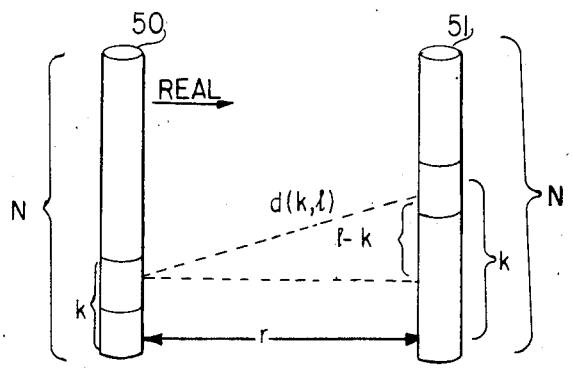
FIG. 2 is a two-dimensional representation of an object and an antenna.

For this analysis, it is assumed that object 50 is a linear array of N elemental loops of unit length as shown in FIG. 2, each being capable of transmitting or receiving a signal in the bandwidth of interest. Antenna 51 is also a linear array of N elemental loops of unit length able to receive or transmit; and r is the separation of the object from the antenna.

In the "Receive Mode", i.e. the object transmitting and the antenna receiving, each point k in the object is assumed to emit radiation f(k) where $f(k) = f_k \exp i(\omega t + \phi_k)$, $f_k \in R$.

A "real" component is arbitrarily selected as pointing as shown in FIG. 2; and an "imaginary" component as pointing out of the page. The entire complex vector f(k), k = 1, ... N is denoted $\vec{f}$; and similarly, the radiation received at antenna positions l = 1, ..., N is denoted a(l), l = 1, ..., N or $\vec{a}$. The problem now is to "guess" at $\vec{f}$, given $\vec{a}$ and the geometry.

Assuming a further simplification of no attenuation effects or phase distortions, the phase change in radians after a propogation distance d will be $2\pi d/\lambda$ where $\lambda$ is the wavelength. Thus if d(l,k) is the distance from object element k to antenna element l the contribution at l from k will be:

$$f(k) \exp 2\pi i d(l,k)/\lambda$$

Summing the total signal at l from all object points gives:

$$a(l) = \sum_{k=1}^{N} f(k) \exp 2\pi i d(l,k)/\lambda \quad (1)$$

where $d(l,k) = [(l-k)^2 + r^2]^{\frac{1}{2}}$

In matrix notation, Eq. (1) is:

$$\vec{a} = R\vec{f}$$

where $R(l,k) = \exp 2\pi i d(l,k)/\lambda$

R is the receive matrix which relates the phase of the transmitted signal from each object element to the received signal as present at each loop of the receiving antenna array. Using a computer and an appropriate matrix-inversion algorithm, a matrix Q can be found such that:

$$QR = \tilde{I} \approx I$$

where I is the unity matrix (ones along the diagonal and zeros elsewhere). The matrix Q is called the "pseudo-inverse" matrix because its multiplication by R yields a "quasi-unity" matrix $\tilde{I}$.

If the measured signal $\vec{a}$ is multiplied by Q:

$$Q\vec{a} = QR\vec{f} \approx \tilde{I}\vec{f} = \vec{f}^* \quad (2)$$

Thus by applying the "pseudo-inverse" to the data, the original signal distribution f can be reconstructed or recovered.

In order to localize a region in the object, reconstruction of one central element of sub-region is all that is necessary. By constraining Q properly to yield a set of quasi-guassians instead of "ones" or delta functions when multiplied by R, the k sub-region selection will happen automatically when Eq. (1) is used to evaluate the object at point k:

$$f(k) = \sum_{l=1}^{N} Q(k,l)a(l)$$

Figure 3:
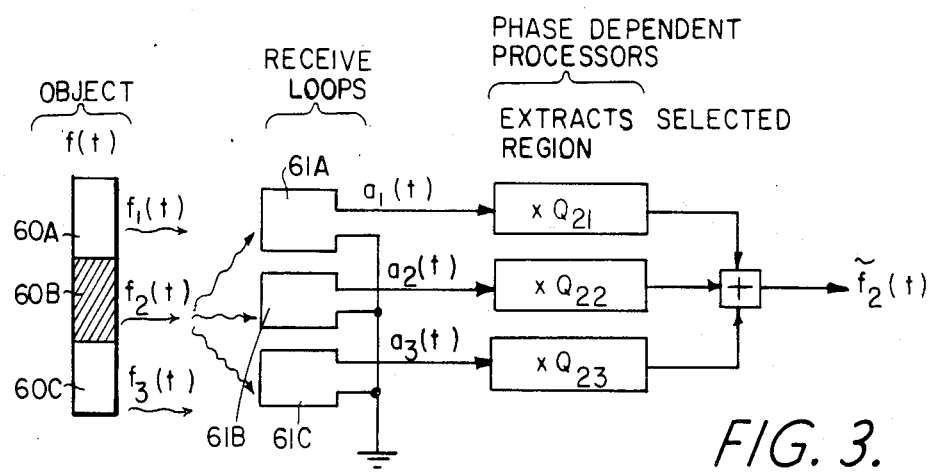
FIG. 3 is a schematic representation of the present invention as it is used in the receiving mode.

Thus, if f(k) is used as the combined received signal, the desired localization will be achieved within the object. This is illustrated schematically in FIG. 3 to which reference is now made. For simplicity, object 60 under investigation consists of three elements 60A, 60B, 60C, each of which emits radiation to receiving antenna array 61 having three loops 61A, 61B 61C. In order to enhance the NMR signal emanating from the selected region, namely element 60B while substantially excluding the signal from outside that region, the signals received by each loop are processed by combining them in a way that takes into account their relative phases and amplitudes. Specifically, the signal from each receiving loop is effectively multiplied by the appropriate complex matrix element. After multiplication, the results are summed into the combined received signal $f_2(t)$.

The above process can be carried out in either the analog or digital domain. In the analog domain, a combination of delay and attenuation or amplification will provide the equivalent of complex multiplication. In the digital domain, phase quadrature detection must occur prior to sampling. The two channels that result from quadrature detection are sampled, digitized, and provide the real and imaginary values that are then multiplied by the appropriate complex matrix element. Digital summing occurs subsequently.

The "transmit mode", where the antenna array is transmitting and the object receiving, is a reciprocal of the "receive mode". If the antenna signal is $\vec{a}$, it becomes $\vec{f}$ when it reaches the object due to phase changes. Hence, $$\vec{f} = T\vec{a}$$

where T is the transmit phasor matrix. Since T depends only on the distance and wavelength, it can be computed as R was in the previous section and a pseudo-inverse S can be found such that:

$$TS = \tilde{I} \approx I \quad (3)$$

A sub-region k in the object can be chosen and defined: let $\vec{v} = \vec{v_k} = \{v(l) = \delta_{l,k} * p(t)\}$, where $\vec{v_k}$ is a vector with "one" in the kth position and "zeros" elsewhere, where $\delta_{l,k}$ is Kronicker's Delta, and p(t) is the desired NMR RF excitation signal. The vector $\vec{v_k}$ is used for localizing the region k that is to receive the RF excitation. However, the vector $\vec{v}$ is a complex vector; and different patterns of "ones" and "zeros" can be chosen to localize or suppress the signal at any location in the volume. For example, it is possible to have all "ones" in the vector v; and in such case, excitation and reception would be uniform throughout the volume. This possibility makes an NMR device into which the present invention is incorporated more versatile because it can be used in a conventional mode with uniform excitation throughout the volume when the vector $\vec{v}$ has all "ones", and shifted into what is termed a localized excitation mode when $\vec{v} = \vec{v_k}$ is used.

The transmitted signal a is obtained by multiplying S by $\vec{v}$:

$$\vec{a} = S\vec{v}$$

The object "sees":

$$\vec{f} = T\vec{a} = TS\vec{v} \approx T\vec{v} = \vec{v} = \vec{v_k}$$

The object is thus excited at the sub-region k only, with localization limited by the approximation of Eq. (3). The present invention contemplates localization of the volume of interest within an object as described above; but it also contemplates using the selection vector $\vec{v}$ to obtain any desired radiation pattern within the object in terms of both relative phase and amplitude. For example, using $\vec{v} = (1,1,1, \text{etc.})$ will insure a constant amplitude and phase RF signal within the object. Similarly, in the receive mode, it is possible to receive from any combination of locations within the object. For example, it is possible to select all object points uniformly; or it is possible to suppress an internal region which is of no interest in a particular study by using $\vec{v} = (1,1,1,0,0,0,1,1,1)$ for example, when receiving or transmitting.

Figure 4:
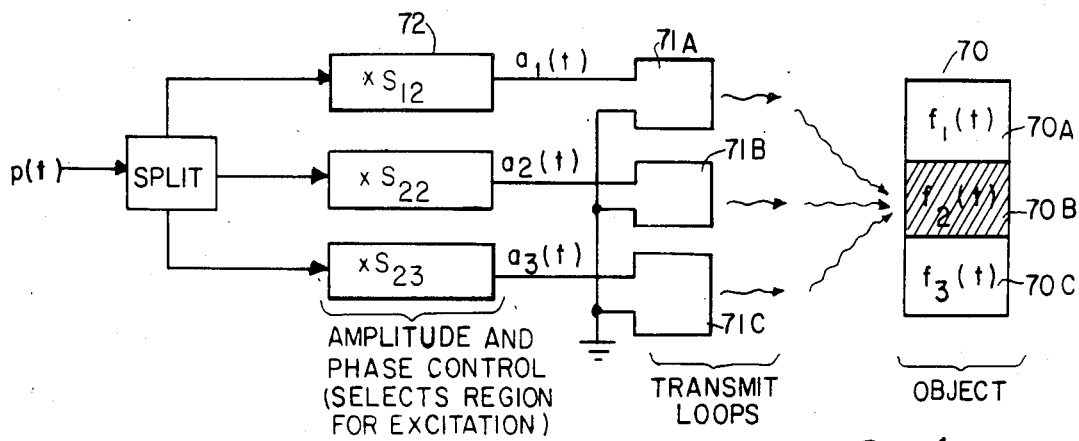
FIG. 4 is a schematic representation of the present invention as it is used in the transmitting mode.

This is illustrated schematically in FIG. 4 to which reference is now made. For simplicity, object 70 under investigation consists of three elements 70A, 70B, 70C, each of which receives radiation from transmitting antenna array 71 having three loops 71A, 71B, 71C. In order to enhance the RF signal present at the selected region, namely element 70B, while substantially reducing the signal from outside that region, the relative phase and amplitude of the signals transmitted by each loop are controlled. Specifically, the conventional RF excitation signal p(t) is applied to processing network 72 which effectively multiplies the excitation signal by the appropriate complex matrix elements. After multiplication, the results are applied to the transmit antenna loops which achieves the desired enhancement.

The processing in network 72 can be carried out in either the analog or digital domain. In the analog domain, a combination of delay and attenuation will provide the equivalent of complex multiplication. In the digital domain, the signal p(t) represents a digital, dual channel, real and imaginary excitation function. For each loop element, p(t) is multiplied by the appropriate complex matrix element of the matrix S. The result is then converted to analog; and a phase quadrature modulation takes place before being amplified and applied to each loop.

Finding a matrix S whose elements are all of uniform magnitude [e.g., $S(k,l) = e^{it\phi kl}$] would be advantageous because the transmitter could be hooked to the antenna array by a fixed set of delay lines to introduce the desired phase automatically without additional attenuators. Also, if a pure phasor S is impossible to attain, it could be constrained to a limited number of magnitudes (say 1, $\frac{1}{2}$ and $\frac{3}{4}$) so that only a limited number of attenuators would be needed.

In an actual situation for both transmit and receive modes, factors will be present which will cause deviations from the ideal assumptions made. Nevertheless, the general approach still holds: if R is known, Q can be computed; and similarly for T and S. R can be found in a non-ideal case by evaluating it empirically. That is to say, a point source (or a small loop) could be moved along the various K positions within an equivalent object (say a water cylinder). The measurements that result at the antenna can be used to calculate R from which Q can be determined.

Similarly for T, transmission from a given antenna loop can be made; and the signal at the various positions k can be meassured using a small loop moving inside a water cylinder object-equivalent allowing subsequent computation of S.

This process can be viewed as a calibration procedure for the system geometry and consistency. It need be done only once assuming these conditions are relatively constant or repeatable.

The formulations developed above based on a 2-D case are actually equally applicable to any dimensionality as long as the antenna array consists of a finite number of loops and the object is considered to consist of a finite number of elements. The vectors $\vec{a}$ and $\vec{f}$ then become linear lists of the components of the antenna and object respectively. The matrix R simply relates the radiation emitted by each object element to the signal measured at each antenna loop. Similarly, the matrix T relates the radiation emitted by each antenna loop to that obtained at each object element. In the ideal case, without attenuation or distortion effects, R and T can be computed as before using the known distance d(l,k) between each receiver-transmitter pair (l,k) and the known wavelength $\lambda$ to yield $R(l,k) = T(l,k) = \exp 2\lambda i d(l,k)/\lambda$. But, as noted above this idealization would normally not apply to a practical situation, in which case a calibration procedure must be performed in which R and T are measured empirically.

In order to calibrate the system, or measure R and T empirically, many individual measurements must be taken at different positions within the test object. Using a single moving test loop this process could take an inordinate length of time. To increase efficiency, an assembly of loops, for example arranged on a plane (such as a flat sheet of Plexiglass) can be used. This assembly can be moved to a given position and then the loops would be activated electronically in sequence. Once all the loops have been activated (for both transmit and receive) the assembly can be moved to the next incremental position.

In a more costly arrangement, the loops can be mounted in a 3-D structure with sufficient number so that no mechanical motion is necessary. In any case, by reducing the mechanical increments the calibration speed is greatly increased and the design simplification by reducing mechanical complexity. Because all loops are strongly coupled, attention must be paid in the design to disable all non-participating loops when a given active loop is transmitting or receiving.

It is believed that the advantages and improved results furnished by the method and apparatus of the present invention are apparent from the foregoing description of the preferred embodiment of the invention. Various changes and modifications may be made without departing from the apirit and scope of the invention as described in the claims that follow.

I claim:

1. An antenna system for nuclear magnetic resonance (NMR) imaging or spectroscopy comprising:
    (a) means to transmit radio-frequency (RF) signals for exciting nuclei in a volume of an object positioned in a substantially uniform magnetic field whose strength is functionally related to the frequency of the RF signal;
    (b) a receiving antenna array comprising a group of loop antennas operatively associated with the object for receiving signals from said volume of the object, each loop antenna in said array producing a separate output signal; and
    (c) signal processing means for processing said output signals to produce processed signals;
    (d) said signal processing means being constructed and arranged to control the relative phases and amplitudes of each of said separate output signals during processing such that the contribution to said processed signals from signals emanating from a selected region of said volume is significantly greater than the contribution from signals emanating from elsewhere in said volume.

2. An antenna system for nuclear magnetic resonance (NMR) imaging or spectroscopy comprising:
    (a) a transmitting antenna array comprising a group of loop antennas operatively associated with an object for transmitting a radio-frequency (RF) signal from each loop that excites nuclei in a volume of the object when the latter is in a substantially uniform magnetic field whose strength is functionally related to the frequency of the RF signal;
    (b) means controlling the phase and amplitude of the signal transmitted by each loop of the transmitting array such that RF signals present in a selective region of said volume are enhanced while signals present elsewhere in said volume are substantially reduced.

3. An antenna array according to claim 1 wherein said means to transmit an RF signal includes a transmitting antenna array comprising a group of loop antennas operatively associated with the object.

4. An antenna array according to claim 3 provided with means separately controlling the relative phases and amplitudes of signals transmitted by the loops of the transmitting array for enhancing RF signals present in a selected region of said volume while substantially reducing signals present elsewhere in said volume.

5. An antenna array according to claim 3 wherein the same antenna array is used for both transmitting and receiving, and means are provided for isolating the transmission path from the receiving path.

6. An antenna array according to either claim 1 or claim 2 wherein the loop antennas are arranged on an electromagnetically transparent cylinder positioned around the object.

7. An antenna array according to claim 6 wherein the loop antennas are uniformly axially arranged on the cylinder.

8. An antenna array according to claim 6 wherein the loop antennas are uniformly azimuthally arranged on the cylinder.

9. An antenna array according to claim 6 wherein the loop antennas are uniformly axially and azimuthally arranged on the cylinder.

10. An antenna array according to claim 1 wherein said signal processing means includes a delay line.

11. An antenna array according to claim 10 wherein said signal processing means includes an attenuator.

12. An antenna array according to claim 2 wherein said means controlling the relative phases and amplitudes includes a delay line.

13. An antenna array according to claim 12 wherein said means controlling the relative phases and amplitudes includes an attenuator.

14. An antenna array according to either claim 1 or claim 2 wherein at least some of the loop antennas are individually addressable.

15. A method for nuclear magnetic resonance (NMR) imaging or spectroscopy of an object positioned in a substantially uniform magnetic field, comprising the steps of:
    (a) transmitting a radio-frequency (RF) signal at a frequency functionally related to the magnetic field strength for exciting nuclei in a voluem of the object;
    (b) receiving signals from the object using a receiving antenna array comprising a group of loop antennas each of which produces a separate output signal; and
    (c) controlling the relative phases and amplitudes of each output signal to produce a combined signal to which the contribution of signals emanating from a selected region of said volume is significantly greater than the contribution of signals from elsewhere in said region.

16. A method according to claim 15 wherein said output signals constitute a signal vector a(t), including the steps of:
    (a) determining the receive matrix R of the receiving antenna array;
    (b) determining a "pseudo-inverse" matrix Q such that matrix multiplication of the matrices Q and R yields an approximate unity matrix I which, up to a scale constant, has approximately "ones" along its diagonal and "zeros" elsewhere; and
    (c) matrix multiplying the vector a(t) by the matrix Q and selecting out of the resulting vector, those elements corresponding to the signals from said selected region within the object.

17. A method according to claim 16 wherein the elements of the matrix Q are constrained to have a limit number of different magnitudes.

18. A method for nuclear magnetic resonance (NMR) imaging or spectroscopy of an object positioned in a substantially uniform magnetic field, comprising the steps of:
    (a) using an antenna array comprising a group of loop antennas operatively associated with the object for transmitting a radio-frequency (RF) signal from each loop, the frequency of each signal being functionally related to the magnetic field whereby nuclei in a volume of the object are excited; and (b) controlling the phase and amplitude of the signal transmitted by each loop of the antenna array such that RF signals present in a selected region of said volume are enhanced while signals present outside that region are substantially reduced.

19. A method according to claim 18 including:
(a) determining a transmit matrix T of the antenna array;
(b) determining a "pseudo-inverse" matrix S such that matrix multiplication of the matrices T and S yields an approximate unity matrix $\tilde{I}$ which, up to a scale constant, has approximately "ones" along its diagonal and "zeros" elsewhere;
(c) determining a selection vector $\vec{v}_k$ which consists of the desired RF excitation signal p(t) at a given component k and zero elsewhere; and
(d) matrix multiplying the matrix S by the vector $\vec{v}_k$ to create a transmit signal vector $\vec{a}$ where $\vec{a} = S\vec{v}_k$ resulting in the formation of the excitation signal p(t) in the selected region of said volume.

20. A method according to claim 19 wherein the elements of the matrix S are constrained to have a limited number of different magnitudes.

21. A method for determining a receive matrix R of a receiving aantenna array comprising a group of loop antennas operatively associated with a simulated test object for receiving signals from a volume of said object positioned in a substantially uniform magnetic field into which a radio frequency signal is transmitted, said method comprising the steps of:
(a) providing a transmit calibration loop antenna for broadcasting a signal that simulates an RF signal from excited nuclei in said object at the location of the calibration loop antenna;
(b) moving said calibration loop antenna to different locations corresponding to different locations within said simulated test object;
(c) measuring the outputs from individual loops of the receiving antenna array as a consequence of step b for determining the ratio of amplitudes and difference in phase between said outputs and the signal that is broadcast by the calibration loop; and
(d) storing the results obtained in step (c) in locations that establish the matrix R.

22. A method for determining a transmit matrix T of a transmitting antenna array comprising a group of loop antennas operatively associated with a simulated test object for transmitting a radio-frequency (RF) signal from each loop to said object when the latter is in a substantially uniform magnetic field whose strength is functionally related to the frequency of the RF signal, said method comprising the steps of:
(a) providing a receive calibration loop antenna for receiving RF signals;
(b) moving said calibration loop antenna to different locations corresponding to different locations within the stimulated test object;
(c) transmitting an RF signal from each loop of the transmit antenna array into said simulated test objects;
(d) measuring the outputs from said calibration loop antenna as a consequence of step (c) for determining the ratio of amplitudes and difference in phase between said outputs and the signal that is broadcast from each loop of the transmit antenna array; and
(e) storing the results obtained in step (c) in locations that establish the matrix T.

23. A method according to either claim 21 or claim 22 wherein said calibration loop antenna is physically moved from to said different locations.

24. A method according to either claim 21 or claim 22 wherein said calibration loop antenna comprises a group of loop antennas, and said method includes sequentially selecting individual loops.

25. A method according to claim 24 including the step of physically moving said group of loop antennas to different locations.

26. An antenna system for nuclear magnetic resonance (NMR) imaging or spectroscopy comprising:
(a) a transmit antenna array comprising a group of loop antennas, and a receive antenna array comprising a group of loop antennas;
(b) signal generating means for producing and applying a set of input antenna signals to the loop antennas of said transmit array such that the latter transmit RF signals of a frequency that perturbs the magnetic moment of nuclei in a volume of an object positioned in a substantially uniform magnetic field whose strength is functionally related to the frequency of said RF signals;
(c) signal processing means;
(d) said receive antenna array being responsive to NMR signals produced by the relaxation of perturbed nuclei in said volume for producing a set of output antenna signals that are applied to said signal processing means; and
(e) control means for selectively controlling the relative phases and amplitudes of at least one set of said antenna signals to control the size and location of said volume in which excitation of nuclei occurs, or from which NMR signals are processed.

27. An antenna system for nuclear magnetic resonance (NMR) imaging or spectroscopy according to claim 26 wherein said control means is constructed and arranged to control the relative phases and amplitudes of the set of antenna signals produced by said signal generating means for controlling the region of said volume in which excitation of nuclei occur.

28. An antenna system according to claim 27 wherein said control means includes means for controlling the relative phases and amplitudes of the set of input antenna signals such that nuclei in only a preselected region of said volume are excited.

29. An antenna system for nuclear magnetic resonance (NMR) imaging or spectroscopy according to claim 26 wherein said control means is constructed and arranged to control the relative phases and amplitudes of the set of antenna signals produced by said receive antenna array for controlling the region of said volume from which NMR signals are processed.

30. An antenna system according to claim 29 wherein said control means includes means for controlling the relative phases and amplitudes of the set of output antenna signals such that only those NMR signals from nuclei in a preselected region of said volume are processed by said signal processing means.

31. An antenna system for nuclear magnetic resonance (NMR) imaging or spectroscopy according to claim 28 including means for controlling the relative phases and amplitudes of the set of output antenna signals produced by said receive antenna array for localizing reception of NMR signals from a preselected region of said volume.

32. An antenna system for nuclear magnetic resonance (NMR) imaging or spectroscopy according to claim 30 including means for controlling the relative phases and amplitudes of the set of input antenna signals produces by said signal generating means for localizing excitation of nuclei in a preselected region of said volume.

33. An antenna system according to claim 27 wherein said control means includes means for controlling the relative phases and amplitudes of the set of input antenna signals such that the RF signal received at each nucleus throughout substantially the entire volume is at substantially the same phase and amplitude.

34. An antenna system according to claim 27 wherein said control means includes means for controlling the relative phases and amplitudes of the set of input antenna signals such that the phase and amplitude of the RF signal received at each nucleus in only a preselected region of said volume are substantially constant.

* * * * *